(12) United States Patent
Suzuki et al.

(10) Patent No.: US 8,441,565 B2
(45) Date of Patent: May 14, 2013

(54) IMAGE PICKUP APPARATUS

(75) Inventors: Zenzo Suzuki, Tokyo (JP); Katsumi Dosaka, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 521 days.

(21) Appl. No.: 12/700,316

(22) Filed: Feb. 4, 2010

(65) Prior Publication Data

US 2010/0225795 A1   Sep. 9, 2010

(30) Foreign Application Priority Data

Mar. 6, 2009   (JP) .................. 2009-053724

(51) Int. Cl.
*H04N 3/14* (2006.01)
*H04N 5/335* (2006.01)

(52) U.S. Cl.
USPC ......... 348/300; 348/250; 348/294; 348/230.1

(58) Field of Classification Search ............... 348/300, 348/230.1, 250, 294
See application file for complete search history.

(56) References Cited

U.S. PATENT DOCUMENTS

| | | | |
|---|---|---|---|
| 6,992,341 B2 | 1/2006 | Watanabe | |
| 7,705,900 B2 | 4/2010 | Guidash | |
| 2008/0291309 A1* | 11/2008 | Gruev et al. .................. 348/308 |
| 2009/0045319 A1 | 2/2009 | Sugawa et al. | |
| 2010/0182465 A1 | 7/2010 | Okita | |

FOREIGN PATENT DOCUMENTS

| | | |
|---|---|---|
| JP | 2005-244435 A | 9/2005 |
| JP | 2006-217410 | 8/2006 |
| JP | 2006-245522 | 9/2006 |
| JP | 2008-546313 A | 12/2008 |
| JP | 2010-9257 | 9/2010 |

OTHER PUBLICATIONS

Japanese Office Action issued in Japanese Patent Application No. 2009-053724, mailed on Jan. 22, 2013, with English translation.

* cited by examiner

*Primary Examiner* — Usman Khan
(74) *Attorney, Agent, or Firm* — McDermott Will & Emery LLP

(57) ABSTRACT

An image pickup apparatus that makes it possible to achieve both high picture quality and a wide dynamic range is provided. Each pixel unit included in the image pickup apparatus includes: four photodiodes; four transfer transistors; a charge storage portion (four floating diffusions) for storing electric charges generated at the photodiodes; an amplification transistor; a select transistor; and a reset transistor. The image pickup apparatus further includes multiple coupling transistors. Each coupling transistor couples together the charge storage portions of two pixel units of the pixel units. A scanning circuit switches on or off the coupling transistors according to read mode.

9 Claims, 9 Drawing Sheets

US 8,441,565 B2

IMAGE PICKUP APPARATUS

CROSS-REFERENCE TO RELATED APPLICATIONS

The disclosure of Japanese Patent Application No. 2009-53724 filed on Mar. 6, 2009 including the specification, drawings and abstract is incorporated herein by reference in its entirety.

BACKGROUND OF THE INVENTION

The present invention relates to an image pickup apparatus having a photoelectric conversion function.

Image sensors of CCD (Charge Coupled Device), CMOS (Complementary Metal-Oxide Semiconductor), and the like are required that their dynamic range should be widened with high sensitivity and a high S/N (Signal-to-Noise) ratio maintained. As image pickup apparatuses whose dynamic range can be widened, for example, the following technologies are known.

In the technology disclosed in Japanese Unexamined Patent Publication No. 2006-217410 (Patent Document 1), each pixel of an image pickup apparatus includes the following: a photodiode, a transfer transistor, a floating diffusion (floating area), an overflow gate, a storage capacitor, a reset transistor, a storage transistor, an amplification transistor, and a select transistor. (Refer to FIG. 1 in the Document.)

The photodiode receives light and generates and stores photocharges. The transfer transistor is provided adjacently to the photodiode and transfers photocharges generated at the photodiode. The floating diffusion is coupled to the photodiode through the transfer transistor. The overflow gate is provided adjacently to the photodiode to transfer photocharges overflowing the photodiode in storage operation. The storage capacitor stores photocharges overflowing the photodiode in storage operation through the overflow gate. The reset transistor is so formed that it is coupled to the floating diffusion and discharges signal charges in the storage capacitor and the floating diffusion. The storage transistor is provided between the floating diffusion and the storage capacitor. The amplification transistor reads as voltage the signal charges of the floating diffusion or the signal charges of the floating diffusion and storage capacitor. The select transistor is coupled to the amplification transistor and selects a pixel or a pixel block.

In the technology disclosed in Japanese Unexamined Patent Publication No. 2006-245522 (Patent Document 2), each pixel of an image pickup apparatus includes the following: a photodiode, a transfer transistor, a floating diffusion, first and second storage capacitors, a reset transistor, first and second storage transistors, an amplification transistor, and a select transistor. (Refer to FIG. 1 in the Document.)

The photodiode receives light and generates photocharges. The transfer transistor is provided adjacently to the photodiode and transfers photocharges generated at the photodiode. The floating diffusion is so provided that it is coupled to the photodiode through the transfer transistor. The first and second storage capacitors store photocharges overflowing the photodiode in exposure storage operation through the transfer transistor. The reset transistor is so formed that it is coupled to the first storage capacitor and discharges signal charges in the first storage capacitor, second storage capacitor, and floating diffusion. The first storage transistor is provided between the floating diffusion and the first storage capacitor. The second storage transistor is provided between the first storage capacitor and the second storage capacitor. The amplification transistor reads as voltage the signal charges of the floating diffusion, the signal charges of the floating diffusion and the first storage capacitor, or the signal charges of the floating diffusion, first storage capacitor, and second storage capacitor. The select transistor is coupled to the amplification transistor and selects a pixel or a pixel block.

PRIOR ART DOCUMENTS

[Patent Documents]
[Patent Document 1]
    Japanese Unexamined Patent Publication No. 2006-217410
[Patent Document 2]
    Japanese Unexamined Patent Publication No. 2006-245522

SUMMARY OF THE INVENTION

In the image pickup apparatuses described in the above documents, it is switched by a transistor switch whether to couple a capacitive element added to each pixel to a floating diffusion. A dynamic range is adjusted based on whether or not a capacitive element is coupled as mentioned above.

In these technologies, however, the percentage of the area occupied by a photodiode in a pixel is reduced as compared with conventional cases because of the addition of the capacitive element and it is suspected to be difficult to maintain high picture quality. Therefore, these technologies are unsuitable for applications such as digital cameras though they may be suitable for applications such as surveillance cameras and in-vehicle cameras in which dynamic range takes precedence over picture quality. In applications such as digital cameras, it is required to maintain high picture quality and further widen a dynamic range.

Therefore, it is an object of the invention to provide an image pickup apparatus that makes it possible to achieve both high picture quality and a wide dynamic range.

In sum, the invention is an image pickup apparatus including multiple pixel units, multiple coupling transistors, and a scanning circuit. Each of the pixel units includes multiple photoelectric conversion elements, multiple transfer transistors, and a charge storage portion.

In each of the pixel units, each photoelectric conversion element generates electric charges corresponding to incident light. The transfer transistors respectively correspond to the photoelectric conversion elements. Each transfer transistor transfers electric charges generated at the corresponding photoelectric conversion element. The charge storage portion is coupled with the photoelectric conversion elements through the transfer transistors and stores electric charges generated at each of the photoelectric conversion elements.

In the image pickup apparatus, each of the coupling transistors couples together the charge storage portions in two pixel unit of the multiple pixel units. In this case, each pixel unit is coupled with at least one of the coupling transistors. The scanning circuit switches on or off the transfer transistors and coupling transistors included in each of the pixel units.

According to the invention, the following processing is carried out when electric charges generated at each photoelectric conversion element are read: a coupling transistor is switched on or off according to light exposure. This makes it possible to vary the capacity of each charge storage portion and thus the dynamic range can be widened. The capacity of each charge storage portion can be made variable by adding one or less junction transistors per pixel unit; therefore, it is

DETAILED DESCRIPTION OF THE PREFERRED EMBODIMENTS

Figure 1:
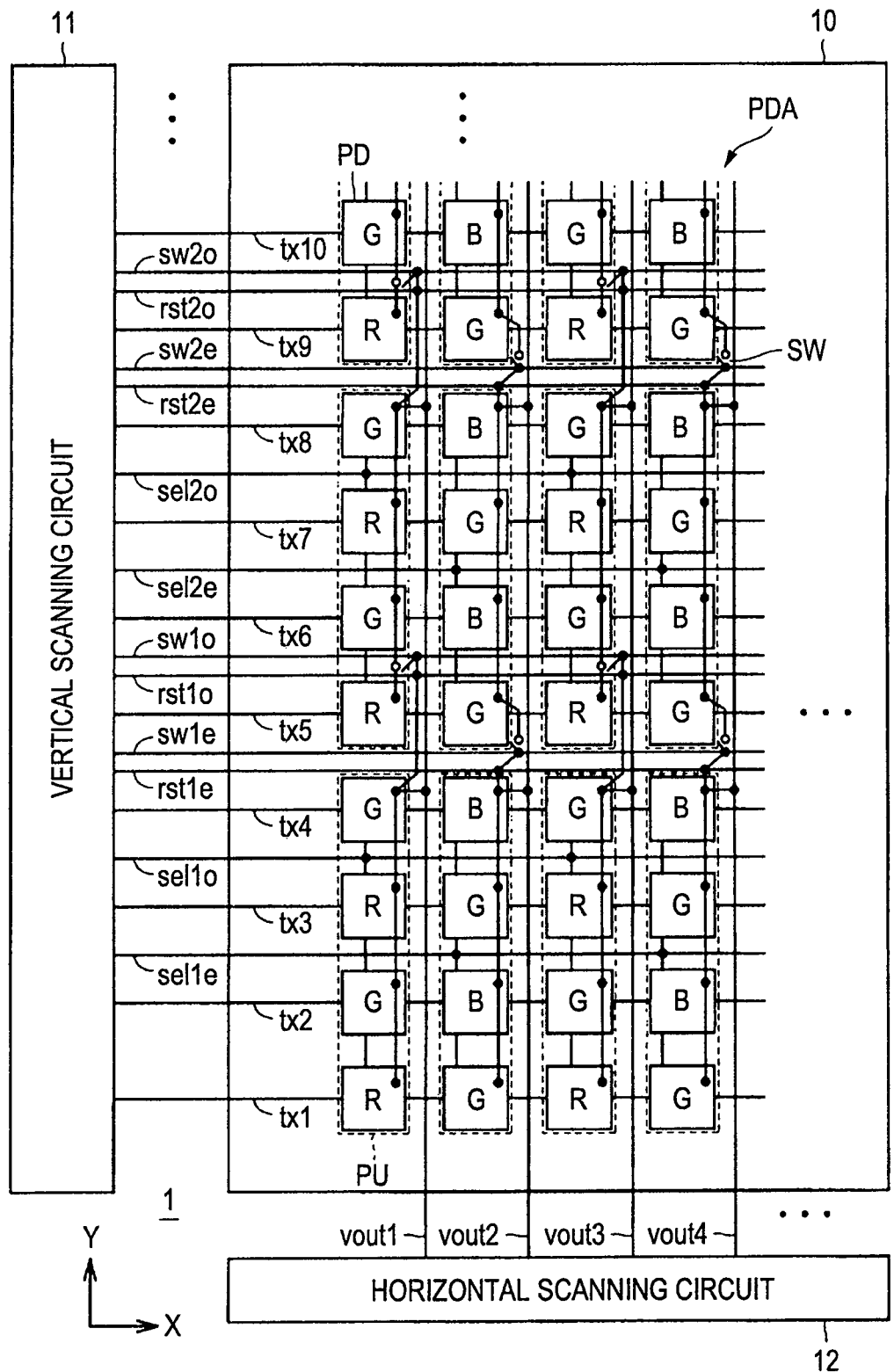
FIG. 1 is a block diagram illustrating the configuration of an image pickup apparatus 1 in a first embodiment of the invention.

Hereafter, detailed description will be given to embodiments of the invention with reference to the drawings. The same or equivalent parts will be marked with the same reference numerals and the description thereof will not be repeated.

(First Embodiment)
(Configuration of Image Pickup Apparatus 1)

FIG. 1 is a block diagram illustrating the configuration of an image pickup apparatus 1 in a first embodiment of the invention.

As illustrated in FIG. 1, the image pickup apparatus 1 includes a pixel array portion 10, a vertical scanning circuit 11, a horizontal scanning circuit 12, multiple control signal lines tx, rst, sel, sw, and multiple output signal lines vout.

The pixel array portion 10 includes a photodiode array PDA (photoelectric conversion element array) comprised of multiple photodiodes PD (photoelectric conversion elements) arranged in a matrix pattern. In FIG. 1, a photodiode array PDA of 10 rows and four columns is shown for the sake of simplicity. Specifically, photodiodes PD in the first column to the fourth column are shown from left to right in FIG. 1 and photodiodes PD in the first row to the 10th row are shown from bottom up in FIG. 1. The left and right direction in FIG. 1 will be designated as X direction, row direction, or horizontal direction and the top and bottom direction in FIG. 1 will be designated as Y direction, column direction, or vertical direction. When the orientations (+ side, − side) along each direction are discriminated, they will be discriminated by affixing a sign like +Y direction and −Y direction.

When the image pickup apparatus 1 is used for color images, a color filter is provided over the light receiving surface of each photodiode PD. In the common Bayer arrangement of color filters, the color filters are arranged as illustrated in FIG. 1. That is, the color filters in green color (G) that are large in the percentage of contribution to luminance signals are arranged in a checkered pattern; and the color filters in red color (R) and blue color (B) are arranged in a checkered pattern in the remaining areas.

In the photodiode array PDA, every four photodiodes successively arranged in each column comprise one group. The four photodiodes PD in each group comprise a pixel unit PU together with multiple transistors. (These transistors are the transfer transistors TX, amplification transistors AMI, select transistors SEL, and reset transistors RST in FIG. 2.) The pixel array portion 10 operates by on a pixel unit PU-by-pixel unit PU basis.

The pixel array portion 10 further includes multiple coupling transistors SW. Each coupling transistor SW is provided between pixel units PU adjoining to each other in the column direction.

When electric charges generated in each photodiode PD are read, each coupling transistor SW is switched on or off according to the read mode of the image pickup apparatus 1. Hereafter, description will be given to the configuration and operation of each pixel unit PU.

Figure 2:
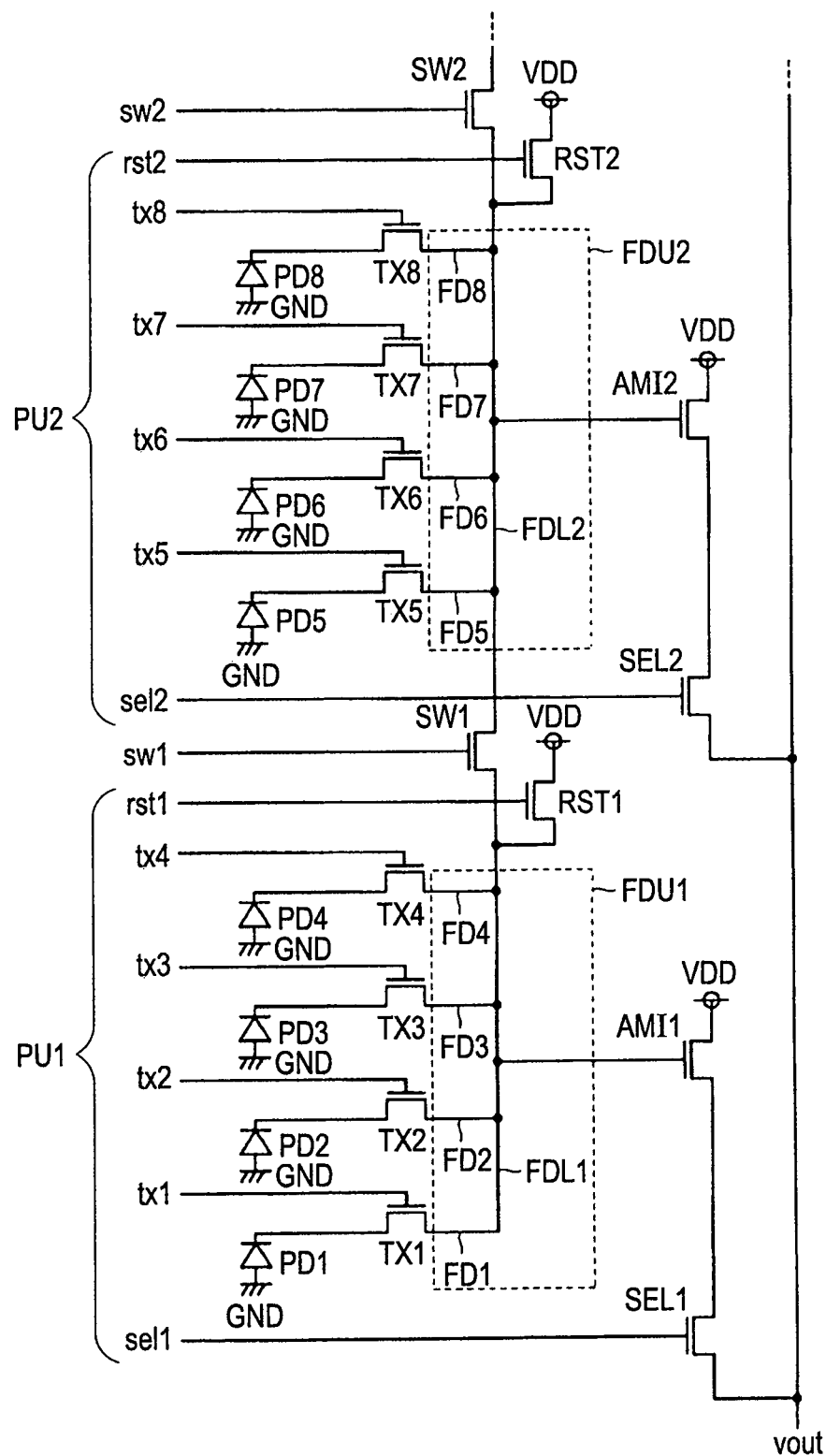
FIG. 2 is an equivalent circuit diagram illustrating one column in the pixel array portion 10 in FIG. 1.

FIG. 2 is an equivalent circuit diagram of a circuit equivalent to one column of the pixel array portion 10 in FIG. 1. The pixel units PU coupled to the output signal lines vout1 to vout4 are identical in electrical circuitry. In FIG. 2, therefore, the pixel units PU1, PU2 are coupled to an arbitrary output signal line vout. In this specification, components of the same kind are discriminated by suffixing a number to their reference numerals, like the photodiodes PD1 to PD8. When the components of the same kind are generically referred to or any unspecified thing is referred to, their reference numerals are indicated without suffixing a number.

The pixel unit PU1 includes: four photodiodes PD1 to PD4, four transfer transistors TX1 to TX4, four floating diffusions (also referred to as floating diffusion portions) FD1 to FD4, one reset transistor RST1, one amplification transistor AMI1, and one select transistor SEL1. The pixel unit PU1 further includes a metal wiring FDL1 that electrically couples the floating diffusions FD1 to FD4 together. The floating diffusions FD1 to FD4 and the metal wiring FDL1 form a charge storage portion FDU1 that stores electric charges generated in each photodiode PD.

The configuration of the pixel unit PU2 is identical. That is, the pixel unit PU2 includes: four photodiodes PD5 to PD8, four transfer transistors TX5 to TX8, four floating diffusions FD5 to FD8, one reset transistor RST2, one amplification transistor AMI2, one select transistor SEL2, and a metal wiring FDL2. The floating diffusions FD5 to FD8 and the metal wiring FDL2 form a charge storage portion FDU2.

FIG. 2 depicts an arbitrary column. When a column is discriminated from the others, a character representing a column number is added. In this case, characters a, b, c, . . . respectively represent first column, second column, third column, . . . . For example, the metal wiring layers FDL in the first column are described as FDL1a, FDL2a, FDL3a, . . . and the metal wiring layers FDL in the second column are described as FDL1b, FDL2b, FDL3b, . . . (Refer to FIG. 7.)

The photodiodes PD1 to PD4 are photoelectric conversion elements that generate electric charges (electrons) according to received light. The generated electric charges are stored in the n-type impurity regions (diffusion regions) of the p-n junction diodes. The p-type impurity regions as the anodes of the photodiodes PD are grounded.

The floating diffusions FD1 to FD4 are n-type impurity regions respectively provided in correspondence with the photodiodes PD1 to PD4. The impurity concentration of the floating diffusions FD is higher than that of the n-type impurity regions (also referred to as n layers) of the photodiodes PD. The floating diffusions FD1 to FD4 are respectively coupled with the cathodes (n layers) of the corresponding photodiodes PD through the transfer transistors TX1 to TX4 as NMOS (N-channel Metal-Oxide Semiconductor) transistors.

The floating diffusions FD1 to FD4 operate as charge storage portions that store electric charges generated in the photodiodes PD1 to PD4. In this case, first, high potential (supply voltage) is applied to each floating diffusion FD and the electric charges are thereby all drawn and they are depleted. When the transfer transistors TX between them and the photodiodes PD are thereafter turned on, the electric charges stored in the n layers of the photodiodes PD are transferred to the floating diffusions FD. At this time, the floating diffusions FD having a higher impurity concentration are higher in depletion potential than the photodiodes PD. Therefore, the electric charges generated in the n layers of the photodiodes PD are all transferred to the floating diffusions FD.

In case of the example in FIG. 2, the floating diffusions FD1 to FD4 are coupled with one another through the metal wiring FDL1. Therefore, the floating diffusions FD1 to FD4 are brought to substantially the same potential. The whole of the floating diffusions FD1 to FD4 and the metal wiring FDL1 forms the charge storage portion FDU1 common to the individual photodiodes PD.

The amplification transistor AMI1 as an NMOS transistor functions as a source follower circuit. The gate of the amplification transistor AMI1 is coupled to the floating diffusions FD1 to FD4 through the metal wiring FDL1 and its drain is coupled to a power supply wiring VDD. The source of the amplification transistor AMI1 is coupled with an output signal line vout through the select transistor SEL1 as an NMOS transistor.

When the select transistor SEL1 is on, the amplification transistor AMI1 outputs signal voltage corresponding to the potential of the floating diffusions FD1 to FD4 to the output signal line Vout. The potential of the floating diffusions FD1 to FD4 is determined according to the number of electric charges transferred from the respective photodiodes PD. At the above time, therefore, the output voltage of the amplification transistor AMI1 is linearly varied according to the amount of light received of each photodiode PD.

The reset transistor RST1 as an NMOS transistor is coupled between the power supply wiring VDD and the metal wiring FDL1. The reset transistor RST1 is provided to discharge the electric charges stored in the floating diffusions FD1 to FD4.

As mentioned above, each pixel unit PU includes the four photodiodes PD and the seven transistors comprised of transfer TX, amplification AMI, select SEL, and reset RST. Therefore, 1.75 transistors are provided per photodiode PD and thus the above configuration of the pixel unit PU is generally designated as 1.75 transistor architecture. The transistors of amplification AMI, select SEL, and reset RST are shared among the four photodiodes PD.

The pixel array portion 10 in FIG. 1 further includes multiple coupling transistors SW as NMOS transistors. Each coupling transistor SW is provided between pixel units PU adjoining to each other in the column direction and couples together the respective charge storage portions FDU of these pixel units PU. In FIG. 2, specifically, a coupling transistor SW1 coupling together the charge storage portion FDU1 of the pixel unit PU1 and the charge storage portion FDU2 of the pixel unit PU2 is depicted. In FIG. 2, further, a coupling transistor SW2 coupling together the charge storage portion FDU2 of the pixel unit PU2 and the charge storage portion of the pixel unit next to the pixel unit PU2 in the +Y direction is depicted.

When electric charges generated in each photodiode PD are read, the coupling transistors SW are switched on or off according to the read mode of the image pickup apparatus 1. As described later, the read modes include, in addition to normal read mode, lower sensitivity read mode in which read operation is carried out with reduced sensitivity and mixture read mode in which the pixels in the same color are mixed when read operation is carried out.

It is generally thought that the sensitivity of each pixel corresponding to one photodiode PD is determined by the product of three values. A first value is quantum efficiency indicating to how many electrons one photon incident upon a photodiode PD is converted. A second value is conversion gain that refers to the ratio of variation in the potential of a photodiode PD to variation in the potential of a floating diffusion FD. A third value is the gain of an amplification transistor AMI. In general, when the structure of a pixel is determined, these values become constant. In the image pickup apparatus 1 in the first embodiment, the conversion gain, or the second value, is made variable by providing the coupling transistors SW that couple together charge storage portions FDU adjoining to each other.

To control the turn-on/off of the transfer transistors TX, select transistors SEL, reset transistors RST, and coupling transistors SW, the control signal lines tx, sel, rst, sw are coupled to the gate electrode of each transistor. More specific description will be given. The control signal lines tx1 to tx8 are respectively coupled to the gates of the transfer transistors TX1 to TX8. The control signal lines sel1, sel1 are respectively coupled to the gates of the select transistors SEL1, SEL2. The control signal lines rst1, rst2 are respectively coupled to the gates of the reset transistors RST1, RST2. The control signal lines sw1, sw2 are respectively coupled to the gates of the coupling transistors SW1, SW2.

Supplementary explanation will be given to the overall configuration of the image pickup apparatus 1 with reference to FIG. 1 again. The image pickup apparatus 1 includes the control signal lines tx, rst, sel, sw extended in the row direction and the output signal lines vout extended in the column direction. The control signal lines tx, rst, sel, sw couple together the vertical scanning circuit 11 and the pixel array portion 10 and the output signal lines vout couple together the horizontal scanning circuit 12 and the pixel array portion 10.

The control signal lines tx for the transfer transistors TX are provided individually in correspondence with the rows of the photodiode array PDA. Each control signal line tx is provided in common to the multiple photodiodes PD comprising the corresponding row. In FIG. 1, the control signal lines tx1 to tx10 respectively provided in correspondence with first row to the 10th row of the pixel array portion 10 are depicted.

The output signal lines vout are provided to read output voltage corresponding to signal charges generated at each photodiode PD. The output signal lines vout are provided in the order of the columns individually in correspondence with the columns of the photodiode array PDA. Each output signal line vout is coupled to the select transistor SEL of each pixel unit PU provided in the corresponding column. In FIG. 1, the output signal lines vout1 to vout4 provided in correspondence with the first column to the fourth column are depicted.

The control signal lines sel for the select transistors SEL include control signals line sel1o, sel2o, . . . for odd-numbered columns and control signal lines sel1e, sel2e, . . . for even-numbered columns. (The odd-numbered columns and the even-numbered columns are discriminated from each other by suffixing a character of o or e to their reference numerals.) Each of the control signal lines sel1o, sel2o, . . . for odd-numbered columns is coupled with the select transistor SEL of the pixel unit PU provided in the corresponding odd-numbered column. Each of the control signal lines sel1o, sel2o, . . . for even-numbered columns is coupled with the select transistor SEL of the pixel unit PU provided in the corresponding even-numbered column. The pixel units PU arranged in the row direction share a control signal line sel among them.

The control signal lines rst for the reset transistors RST include control signal lines rst1o, rst2o, . . . for odd-numbered columns and control signal lines rst1e, rst2e, . . . for even-numbered columns. The control signal lines rst1o, rst2o, . . . for odd-numbered columns are coupled with the reset transistors RST of the pixel units PU provided in the respective odd-numbered columns. The control signal lines rst1e, rst2e, . . . for even-numbered columns are coupled with the reset transistors RST of the pixel units PU provided in the respective even-numbered columns. The pixel units PU arranged in the row direction share a control signal line rst among them.

The control signal lines sw for the coupling transistors SW include control signal lines sw1o, sw2o, . . . for odd-numbered columns and control signal line sw1e, sw2e, . . . for even-numbered columns. Each of the control signal lines sw1o, sw2o, . . . for odd-numbered columns is coupled with the coupling transistor SW provided between pixel units PU adjoining to each other in the corresponding odd-numbered column. Each of the control signal lines sw1e, sw2e, . . . for even-numbered columns is coupled with the coupling transistor SW provided between pixel units PU adjoining to each other in the corresponding even-numbered column. The coupling transistors SW arranged in the row direction share a control signal line sw among them.

The vertical scanning circuit 11 sequentially switches the voltage of the control signal lines tx, rst, sel to the H level or the L level. At this time, the vertical scanning circuit 11 switches the control signal lines sw to the H level or the L level according to the read mode. As a result, the voltage corresponding to the amount of electric charges stored in each row of the photodiode array PDA is outputted to an output signal line vout with respect to each row of the photodiode array PDA. The horizontal scanning circuit 12 sequentially reads voltages outputted to the output signal lines vout and thereby detects the amount of light received of each photodiode PD.

(Read Operation of Image Pickup Apparatus 1—Normal Read Mode)

Concrete description will be given to the procedure for reading the signal charges of each photodiode PD in the image pickup apparatus 1. First, description will be given to normal read mode in which the electric charges generated in each photodiode PD are individually read on a photodiode PD-by-photodiode PD basis.

Figure 3:
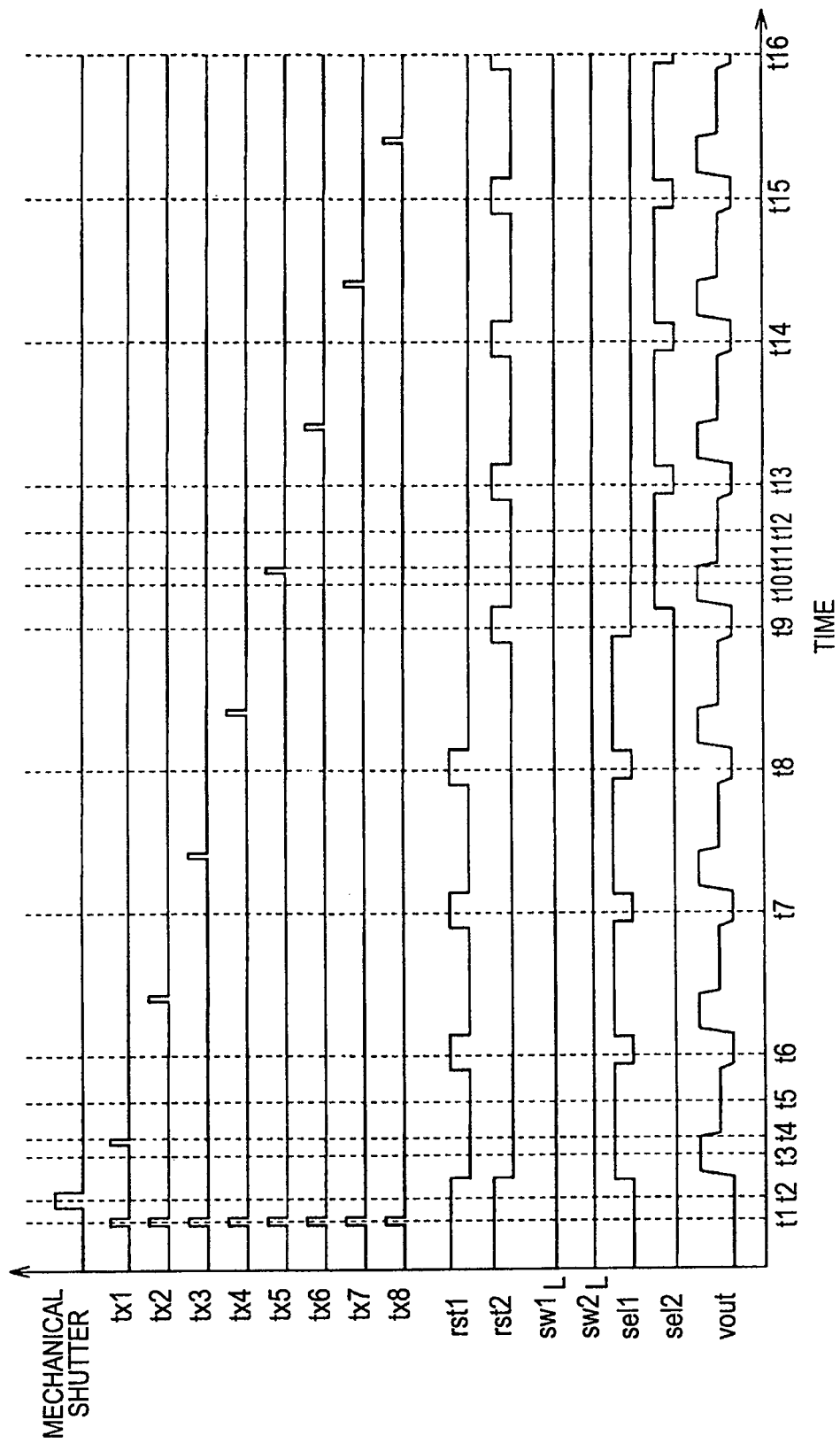
FIG. 3 is a timing chart explaining the read operation of the image pickup apparatus 1 in normal read mode.

FIG. 3 is a timing chart explaining the read operation of the image pickup apparatus 1 in normal read mode. FIG. 3 indicates the following from top down: the opened/closed state of a mechanical shutter, the voltage waveforms of the control signal lines tx1 to tx8, rst1, rst2, sw1, sw2, sel1, sel2 in FIG. 2, and the voltage waveform of an output signal line vout. In normal read mode, the voltages of the control signal lines sw1, sw2 are at the L level in every period of time and the coupling transistors SW1, SW2 are kept off. Hereafter, description will be given to the procedure for reading the signal charges of each photodiode PD in the pixel units PU1, PU2 in order of time with reference to FIG. 2 and FIG. 3.

At time t1, the voltages of the control signal lines tx1 to tx8, rst1, rst2 are at the H level and the voltages of the control signal lines sel1, sel2 are at the L level. Therefore, the transfer transistors TX1 to TX8 and the reset transistors RST1, RST2 are on. As a result, the electric charges in the n layers of the photodiodes PD1 to PD8 and the floating diffusions FD1 to F8 are all drawn and they are depleted. When the voltages of the control signal lines tx1 to tx8 are thereafter returned to the L level, the transfer transistors TX1 to TX8 are turned off.

At time t2, subsequently, the mechanical shutter is opened. While the shutter is open, electric charges are generated at the photodiodes PD1 to PD8 by incident light and stored in the n layers of the photodiodes PD1 to PD8.

At time t3 after the shutter is closed, the voltages of the control signal lines rst1, rst2 are at the L level; the voltage of the control signal line sel1 is at the H level; and the voltage of the control signal line sel2 is at the L level. As a result, the reset transistors RST1, RST2 are turned off and the select transistor SEL1 is turned on. Therefore, output voltage corresponding to the depletion potential of the floating diffusions FD1 to FD4 (the potential of the charge storage portion FDU1) is outputted to an output signal line vout. The horizontal scanning circuit 12 in the FIG. 1 detects the voltage of the output signal line vout at this time as dark level output.

At time t4, subsequently, the voltage of the control signal line tx1 is brought to the H level and thus the transfer transistor TX1 is turned on. As a result, the electric charges of the photodiode PD1 are transferred to the floating diffusions FD1 to FD4. The potential of the floating diffusions FD1 to FD4 is changed to a value corresponding to the number of electric charges transferred from the photodiode PD1 and in conjunction therewith, the voltage of the output signal line vout is varied.

At time t5 after the voltage of the control signal line tx1 is returned to the L level, the horizontal scanning circuit 12 in FIG. 1 detects the voltage of the output signal line vout at this time. The difference from the dark level output detected at time t3 becomes the light reception signal of the photodiode PD1.

At time t6, subsequently, the voltage of the control signal line rst1 is at the H level and the voltage of the control signal line sel1 is at the L level. As a result, the electric charges of the floating diffusions FD1 to F4 are all drawn and they are initialized. This terminates the readout of signal charges obtained by receiving light at the photodiode PD1 and preparation for the readout of signal charges of the next photodiode PD2 is completed.

During the period from time t6 to time t7, subsequently, the same process as during the period from time t3 to time t6 is carried out on the photodiode PD2 and the signal charges generated at the photodiode PD2 are read. During the period from time t7 to time t8, similarly, the signal charges generated at the photodiode PD3 are read and during the period from time t8 to time t9, the signal charges obtained by receiving light at the photodiode PD4 are read. This completes the readout of the pixel unit PU1.

At time t9, the voltage of the control signal line rst1 is at the L level and the voltage of the control signal line rst2 is at the H level. Further, the voltages of the control signal lines sel1, sel2 are at the L level. As a result, the reset transistor RST2 is turned on and the electric charges of the floating diffusions FD5 to FD8 are all drawn and they are initialized. This completes preparation for reading the signal charges of the photodiode PD5 of the next pixel unit PU2.

At time t10, subsequently, the voltage of the control signal line sel2 is brought to the H level and a dark level signal of the floating diffusions FD5 to FD8 (charge storage portion FDU2) is thereby outputted. At time t11, thereafter, the control signal line tx5 is brought to the H level and the transfer transistor TX5 is thereby turned on. As a result, the electric charges of the photodiode PD5 are transferred to the floating diffusions FD5 to FD8. At time t12, subsequently, voltage corresponding to the transferred electric charges is read through the output signal line vout.

The same read operation is performed during the period from t13 to time t14, during the period from time t14 to time t15, and during the period from time t15 to time t16. The signal charges generated in the photodiodes PD6 to PD8 are thereby sequentially read. This completes the readout of the pixel unit PU2.

(Read Operation of Image Pickup Apparatus 1—Lower Sensitivity Read Mode)

Description will be given to lower sensitivity read mode in which readout is carried out with the sensitivity of the image pickup apparatus 1 reduced.

In general, image sensors for digital cameras are required to have a wide range of ISO sensitivity. At this time, it is required to obtain high-resolution picture quality in a low ISO sensitivity range within which light exposure is high. Further, it is required to increase an S/N ratio as much as possible to obtain an image with less noise in a high ISO sensitivity range within which light exposure is low.

To improve an S/N ratio in a high ISO sensitivity range, increasing photoelectric conversion efficiency is effective. If this is done, however, the signal level is early saturated in a low ISO sensitivity range (overexposure becomes excessive in images) and the dynamic range is narrowed.

Consequently, the following measure is taken in the image pickup apparatus 1 in lower sensitivity read mode: in a low ISO sensitivity range within which light exposure is high, the coupling transistor SW provided between a pixel unit PU provided with a photodiode PD to be read and the pixel unit PU adjacent thereto is turned on. This increases the capacity of the charge storage portion FDU; therefore, the saturation of signal level in the low ISO sensitivity range can be prevented.

Figure 4:
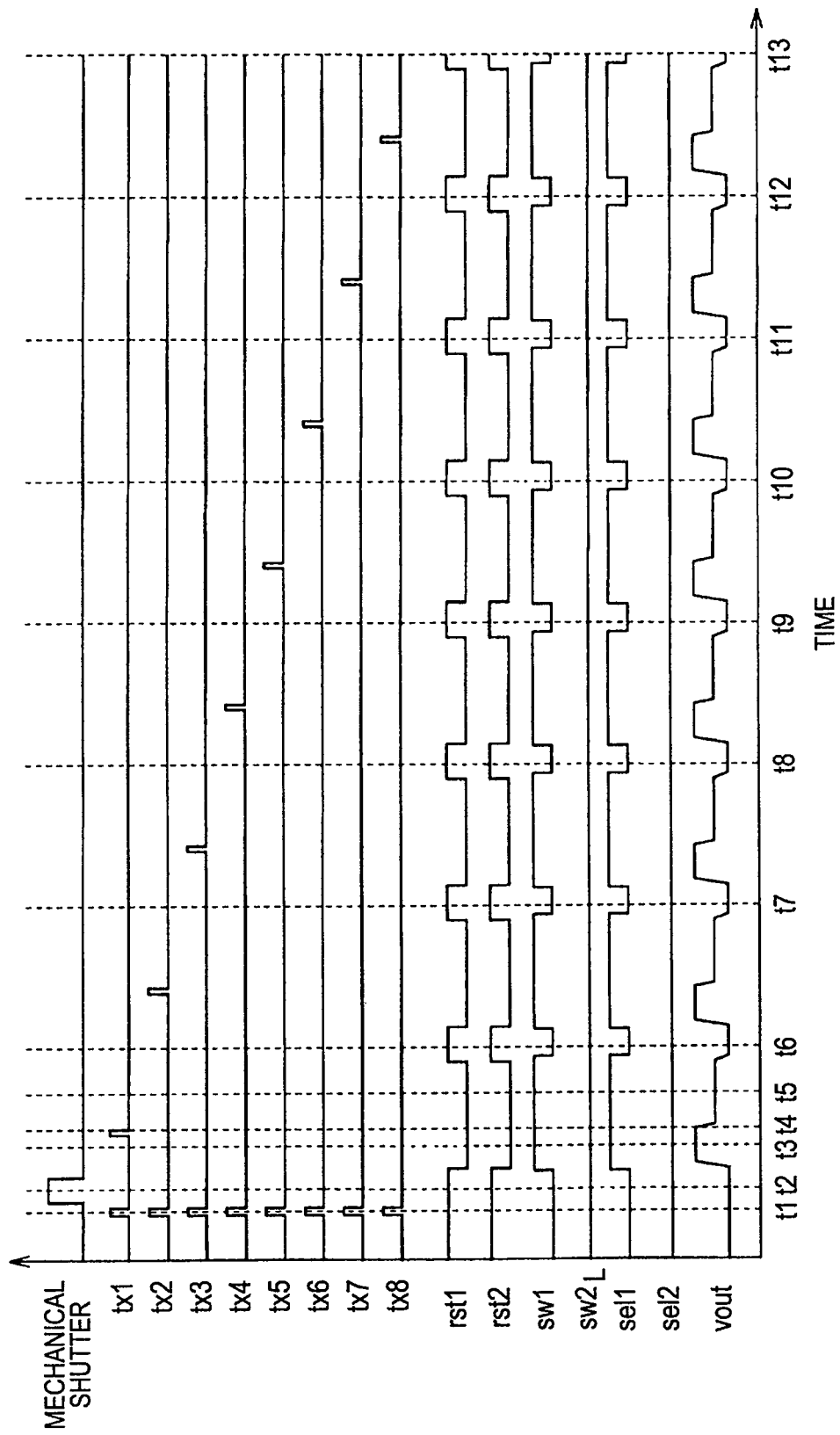
FIG. 4 is a timing chart explaining the read operation of the image pickup apparatus 1 in lower sensitivity read mode.

FIG. 4 is a timing chart explaining the read operation of the image pickup apparatus 1 in lower sensitivity read mode. The vertical axis in FIG. 4 indicates the same items as that in FIG. 3. Hereafter, description will be given to the procedure for reading the signal charges of each photodiode PD in the pixel units PU1, PU2 in order of time with reference to FIG. 2 and FIG. 4. The operations at time t1 and time t2 are the same as those in FIG. 3 and the description thereof will not be repeated.

At time t3 after the shutter is closed, the voltages of the control signal lines rst1, rst2 are at the L level; the voltages of the control signal lines sw1, sel1 are at the H level; and the voltages of the control signal lines sw2, sel2 are at the L level. Therefore, the reset transistors RST1, RST2 are off and the coupling transistor SW1 and the select transistor SEL1 are on. As a result, the charge storage portions FDU1 and FDU2 are coupled together by the coupling transistor SW1 in the on state. Therefore, output voltage corresponding to the depletion potential of the floating diffusions FD1 to FD8 (the potential of the entire charge storage portions FDU1 and FDU2) is outputted to the output signal line vout. The horizontal scanning circuit 12 in FIG. 1 detects the voltage of the output signal line vout at this time as dark level output.

At time t4, subsequently, the voltage of the control signal line tx1 is brought to the H level and thus the transfer transistor TX1 is turned on. As a result, the electric charges of the photodiode PD1 are transferred to the floating diffusion FD1 to FD8 (the entire charge storage portions FDU1 and FDU2). The potential of the floating diffusions FD1 to FD8 is changed to a value corresponding to the number of electric charges transferred from the photodiode PD1 and in conjunction therewith, the voltage of the output signal line vout is varied.

At this time, the capacity of the charge storage portions FDU is approximately twice that in normal read mode; therefore, the potential of the charge storage portions FDU is substantially half of that in normal read mode. Consequently, the saturation of the output voltage vout can be prevented.

At time t5 after the voltage of the control signal line tx1 is returned to the L level, the horizontal scanning circuit 12 in FIG. 1 detects the voltage of the output signal line vout at this time. The difference from the dark level output detected at time t3 becomes the light reception signal of the photodiode PD1.

At time t6, subsequently, the voltages of the control signal lines rst1, rst2 are at the H level and the voltages of the control signal lines sw1, sw2, sel1, sel2 are at the L level. As a result, the electric charges of the floating diffusions FD1 to FD8 are all drawn and they are initialized. This terminates the readout of signal charges obtained by receiving light at the photodiode PD1 in lower sensitivity read mode and preparation for the readout of signal charges of the next photodiode PD2 in lower sensitivity read mode is completed.

During the period from time t6 to time t7, subsequently, the same process as during the period from time t3 to time t6 is carried out on the photodiode PD2 and the signal charges generated at the photodiode PD2 are read. During the period from time t7 to time t8, similarly, the signal charges generated at the photodiode PD3 are read and during the period from time t8 to time t9, the signal charges obtained by receiving light at the photodiode PD4 are read. This completes the readout of the pixel unit PU1 in lower sensitivity read mode.

Also with respect to the pixel unit PU2, the signal charges of the photodiodes PD5 to PD8 are similarly read when the voltage of the control signal line sw1 is at the H level (the coupling transistor SW1 is on). That is, the same read operation as in the pixel unit PU1 is carried out during the following periods: the period from time t9 to time t10, the period from time t10 to time t11, the period from time t11 to time t12, and the period from time t12 to time t13. As a result, the signal charges of the photodiodes PD5 to PD8 are read. This completes the readout of the pixel unit PU2 in lower sensitivity read mode.

(Read Operation of Image Pickup Apparatus 1—Two-Pixel Mixture Read Mode)

Description will be given to two-pixel mixture read mode in which two pixels in the same color are mixed when read operation is performed.

The number of pixels of each recent digital still camera has been significantly increased and that of some cameras exceeds 10 million (10M) pixels. When a digital camera is used to take not only freeze-frame pictures but also moving video pictures, however, a problem arises. When all the 10 million (10M) pixels are used to take a moving video picture, the number of pixels is too large and this is not practical. This is apparent from the fact that even the full-HD (Full High Definition) digital television is approximately two million (2M) pixels in the number of pixels.

When it is required to carry out high-speed readout as in taking a moving video picture as mentioned above, pixel mixture readout is an effective means. In the pixel mixture readout, the electric charges generated in multiple pixels (photodiodes PD) in the same color are mixed when they are read. The pixel mixture readout is an effective technique also to enhance an S/N ratio to obtain an image with less noise in a high ISO sensitivity range within which the readout light exposure is low.

Hereafter, description will be given to two-pixel mixture read mode. In this case, the following operation is performed, for example, at each pixel unit PU in the first column in FIG.

1: two pixels in green color (G) or red color (R) are mixed and read. At each pixel unit PU in the second column, two pixels in green color (G) or blue color (B) are mixed and read. Therefore, when two-pixel mixture readout is carried out with the 1.75 transistor architecture, it can be carried out with each coupling transistor SW kept off.

Figure 5:
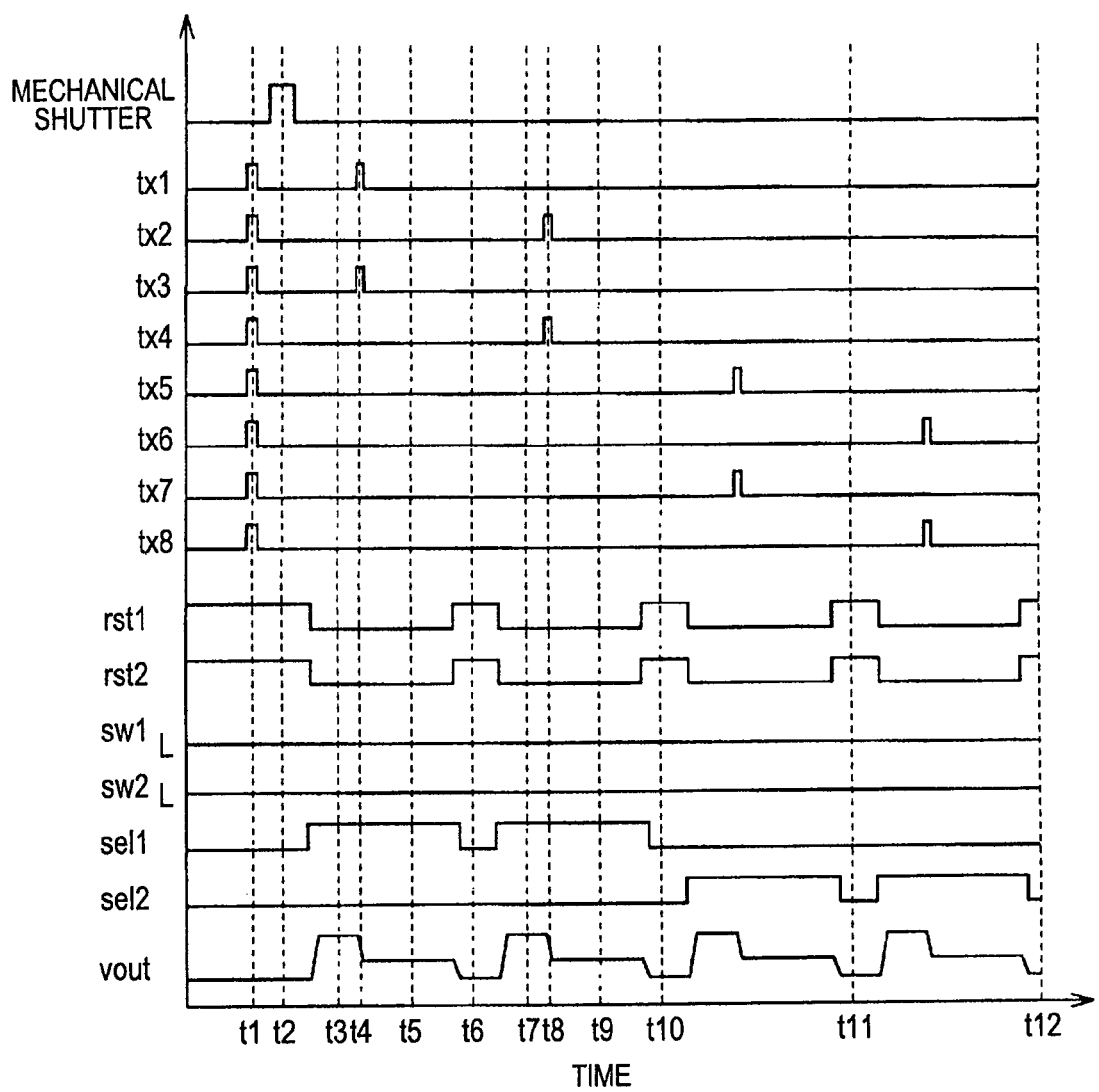
FIG. 5 is a timing chart explaining the read operation of the image pickup apparatus 1 in two-pixel mixture read mode.

FIG. 5 is a timing chart explaining the read operation of the image pickup apparatus 1 in two-pixel mixture read mode. The vertical axis in FIG. 5 indicates the same items as that in FIG. 3. In two-pixel mixture read mode, the voltages of the control signal lines sw1, sw2 are at the L level in every period of time and the coupling transistors SW1, SW2 are kept off. Hereafter, description will be given to the procedure for reading the signal charges of each photodiode PD in the pixel units PU1, PU2 in order of time with reference to FIG. 2 and FIG. 5. The operation during the period from time t1 to time t3 is the same as that in FIG. 3 and the description thereof will not be repeated.

At time t4, the voltages of the control signal lines tx1, tx3 are brought to the H level and thus the transfer transistors TX1, TX3 are turned on. As a result, the mixed electric charges of the photodiodes PD1, PD3 are transferred to the floating diffusions FD1 to FD4. (In case of odd-numbered columns in FIG. 1, the photodiodes PD1, PD3 correspond to red color (R); and in case of even-numbered columns, the photodiodes PD1, PD3 correspond to green color (G).) The potential of the floating diffusions FD1 to FD4 is changed to a value corresponding to the number of electric charges transferred from the photodiodes PD1, PD3 and in conjunction therewith, the voltage of the output signal line vout is varied.

At time t5 after the voltages of the control signal lines tx1, tx3 are returned to the L level, the horizontal scanning circuit 12 in FIG. 1 detects the voltage of the output signal line vout. The difference from the dark level output detected at time t3 becomes a signals arising from the mixed electric charges of the photodiodes PD1, PD3.

At time t6, subsequently, the voltages of the control signal lines rst1, rst2 are at the H level and the voltages of the control signal lines sel1, sel2 are at the L level. As a result, the electric charges of the floating diffusions FD1 to FD8 are all drawn and they are initialized. This terminates the readout of signal charges obtained by receiving light at the photodiodes PD1, PD3 and preparation for the readout of signal charges of the next photodiodes PD2, PD4 is completed. (In case of odd-numbered columns in FIG. 1, the photodiodes PD2, PD4 correspond to green color (G); and in case of even-numbered columns, the photodiodes PD2, PD4 correspond to blue color (B).)

During the period from time t6 to time t10, subsequently, the same process as during the period from time t3 to time t6 is carried out on the photodiodes PD2, PD4 and the signal charges generated at the photodiodes PD2, PD4 are read. More specific description will be given. At time t7, the voltage of the control signal line sel1 is at the H level and a dark level voltage signal is outputted to the output signal line vout. At time t8, the control signal lines tx2, tx4 are brought to the H level. Therefore, the mixed electric charges of the electric charges generated at the photodiodes PD2, PD4 are transferred to the floating diffusions FD1 to FD4 (charge storage portion FDU1). At time t9 after the control signal lines tx2, tx4 are returned to the L level, the voltage of the output signal line vout corresponding to the mixed electric charges of the photodiodes PD2, PD4 is detected by the horizontal scanning circuit 12 in FIG. 1. The difference from the dark level output detected at time t7 becomes a signal arising from the mixed electric charges of the photodiodes PD2, PD4. This completes the readout of the signal charges of the pixel unit PU1 in two-pixel mixture mode.

Subsequently, the similar operation is performed. That is, during the period from time t10 to time t11, the voltage of the control signal line sel2 is at the H level and the voltages of the control signal lines tx5, tx7 are brought to the H level. As a result, voltage corresponding to the mixed electric charges of the photodiodes PD5, PD7 is outputted to the output signal line vout.

During the period from time t11 to time t12, voltage corresponding to the mixed electric charges of the photodiodes PD6, PD8 is outputted to the output signal line vout. This completes the readout of the signal charges of the pixel unit PU2 in two-pixel mixture mode.

(Read Operation of Image Pickup Apparatus 1—Three-Pixel Mixture Read Mode)

Description will be given to three-pixel mixture read mode in which three pixels in the same color are mixed when read operation is performed.

In case of three-pixel mixture readout, the following operation is performed, for example, at the pixel units PU in the first column in FIG. 1: three pixels in green color (G) or red color (R) are mixed and read. At the pixel units PU in the second column, three pixels in green color (G) or blue color (B) are mixed and read. Therefore, when three-pixel mixture readout is carried out with the 1.75 transistor architecture, it is required to turn on the coupling transistor SW between pixel units PU adjoining to each other.

Figure 6:
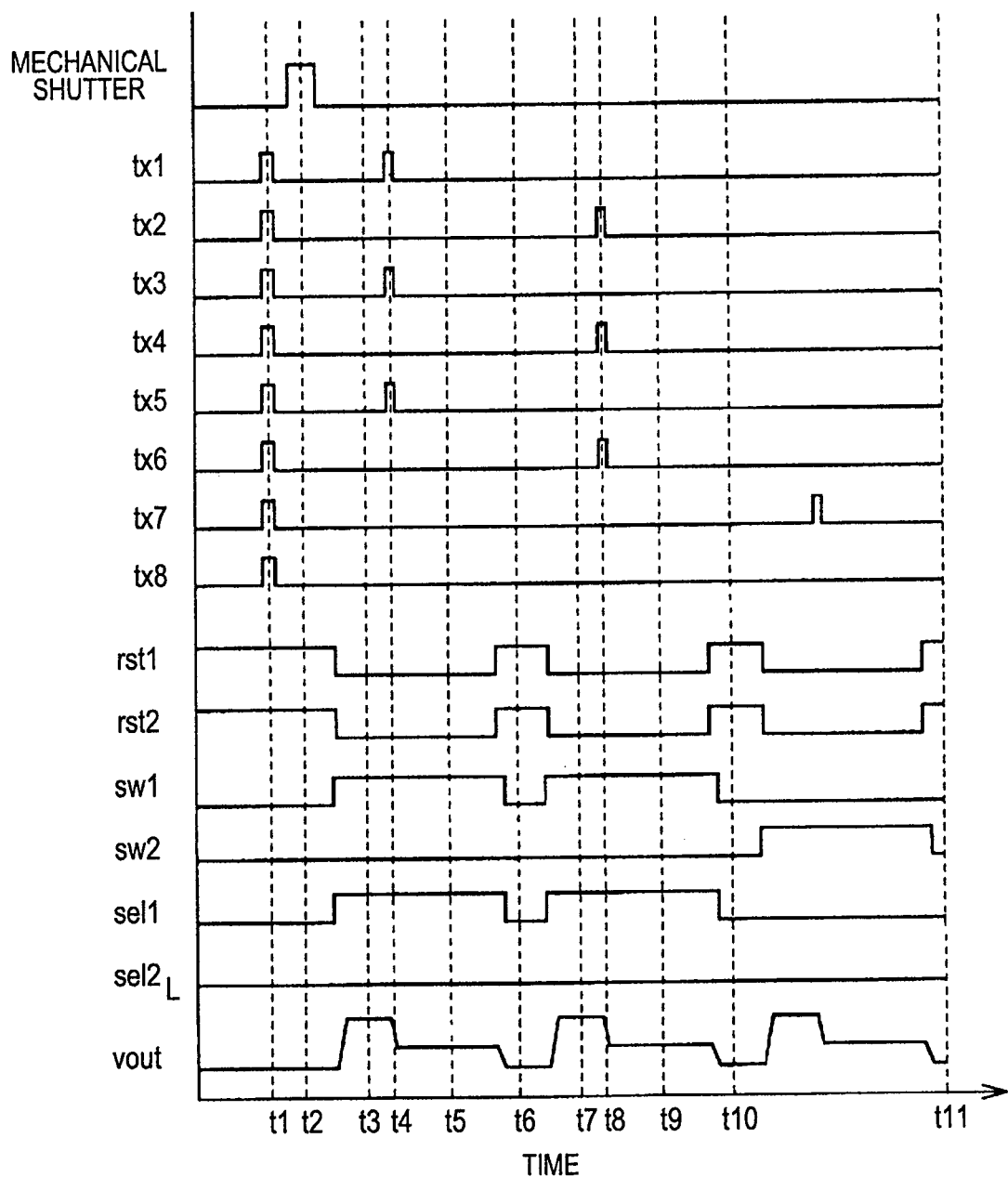
FIG. 6 is a timing chart explaining the read operation of the image pickup apparatus 1 in three-pixel mixture read mode.

FIG. 6 is a timing chart explaining the read operation of the image pickup apparatus 1 in three-pixel mixture read mode. The vertical axis in FIG. 6 indicates the same items as that in FIG. 3. Hereafter, description will be given to the procedure for reading the signal charges of each photodiode PD in the pixel units PU1, PU2 in order of time with reference to FIG. 2 and FIG. 6. The operation during the period from time t1 to time t3 is the same as that in FIG. 4 and the description thereof will not be repeated.

At time t4, the voltages of the control signal lines tx1, tx3, tx5 are brought to the H level and thus the transfer transistors TX1, TX3, TX5 are turned on. Since the coupling transistor SW1 is on, the mixed electric charges of the photodiodes PD1, PD3, PD5 are transferred to the floating diffusions FD1 to FD8 (the entire charge storage portions FDU1 and FDU2). (In case of odd-numbered columns in FIG. 1, the photodiodes PD1, PD3, PD5 correspond to red color (R); and in case of even-numbered columns, the photodiodes PD1, PD3, PD5 correspond to green color (G).) The potential of the floating diffusions FD1 to FD8 is changed to a value corresponding to the number of electric charges transferred from the photodiodes PD1, PD3, PD5 and in conjunction therewith, the voltage of the output signal line vout is varied.

At time t5 after the voltages of the control signal lines tx1, tx3, tx5 are returned to the L level, the horizontal scanning circuit 12 in FIG. 1 detects the voltage of the output signal line vout at this time. The difference from the dark level output detected at time t3 becomes a signal arising from the mixed electric charges of the photodiodes PD1, PD3, PD5.

At time t6, subsequently, the voltages of the control signal lines rst1, rst2 are at the H level and the voltages of the control signal lines sw1, sw2, sel1, sel2 are at the L level. As a result, the electric charges of the floating diffusions FD1 to FD8 are all drawn and they are initialized. This terminates the readout of signal charges obtained by receiving light at the photodiodes PD1, PD3, PD5 and preparation for the readout of signal charges of the next photodiodes PD2, PD4, PD6 is completed. (In case of odd-numbered columns in FIG. 1, the photodiodes PD2, PD4, PD6 correspond to green color (G); and in case of even-numbered columns, the photodiodes PD2, PD4, PD6 correspond to blue color (B).)

During the period from time t6 to time t10, subsequently, the same process as during the period from time t3 to time t6 is carried out on the photodiodes PD2, PD4, PD6 and signal charges generated at the photodiodes PD2, PD4, PD6 are read. More specific description will be given. At time t7, the voltages of the control signal lines sw1, sel1 are at the H level and a dark level voltage signal is outputted to the output signal line vout. At time t8, the control signal lines tx2, tx4, tx6 are brought to the H level. Therefore, the mixed electric charges of the electric charges generated at the photodiodes PD2, PD4, PD6 are transferred to the floating diffusions FD1 to FD8 (the entire charge storage portions FDU1 and FDU2). At time t9 after the control signal lines tx2, tx4, tx6 are returned to the L level, the voltage of the output signal line vout corresponding to the mixed electric charges of the photodiodes PD2, PD4, PD6 is detected by the horizontal scanning circuit 12 in FIG. 1. The difference from the dark level output detected at time t7 becomes a signal arising from the mixed electric charges of the photodiodes PD2, PD4, PD6.

At time t10, subsequently, the voltages of the control signal lines rst1, rst2 are at the H level and the voltages of the control signal lines sw1, sw2, sel1, sel2 are at the L level. As a result, the electric charges of the floating diffusions FD1 to FD8 are all drawn and they are initialized. This terminates the readout of signal charges obtained by receiving light at the photodiodes PD2, PD4, PD6 and preparation for the readout of signal charges of three pixels of the next photodiode PD7 and the following diodes. (In case of odd-numbered columns in FIG. 1, the three pixels correspond to red color (R); and in case of even-numbered columns, the three pixels correspond to green color (G).)

During the period from time t10 to time t11, the mixed electric charges of three pixels of the photodiode PD7 and the following diodes are read. At this time, the voltage of the control signal line tx2, in place of the control signal line tx1, is brought to the H level to carry out three-pixel mixture. As a result, the coupling transistor SW2 is turned on.

The above mentioned mixture readout of pixels in the same color is not limited to two-pixel or three-pixel and more pixels can be read.

(Layout of Pixel Array Portion 10)

Description will be given to the layout of the photodiodes PD, floating diffusions FD, and transistors AMI, SEL, RST, SW in the pixel array portion 10.

Figure 7:
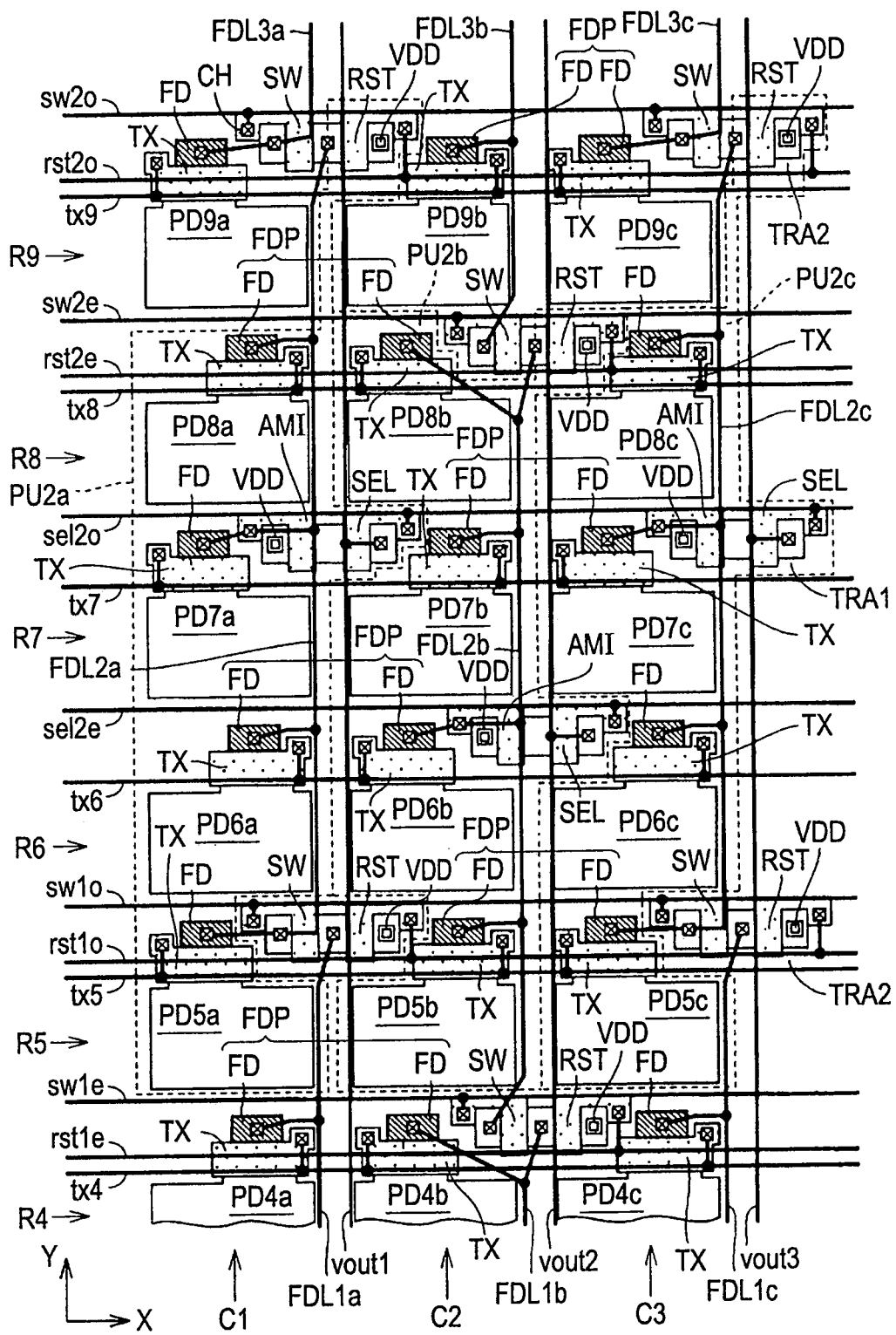
FIG. 7 is a plan view schematically illustrating the layout of a pixel array portion 10.

FIG. 7 is a plan view schematically illustrating the layout of the pixel array portion 10. FIG. 7 depicts the arrangement of the photodiodes PD in the first columns to the third column (C1 to C3) and in the fourth row to the ninth row (R4 to R9) in the pixel array portion 10 in FIG. 1. In FIG. 7, a numeral representing a row number and a character representing a column number are suffixed to the reference numeral of each photodiode PD. The characters a, b, c . . . respectively represent first column, second column, third column . . . .

Further, FIG. 7 depicts the arrangement of the floating diffusions FD, transfer transistors TX, amplification transistors AMI, select transistors SEL, reset transistor RST, and coupling transistors SW related to these photodiodes PD. The areas of the floating diffusions FD and the areas of the gate electrodes of the transfer transistors TX are hatched for the sake of simplicity of the drawing.

Further, the FIG. 7 also depicts the relation of coupling between each transistor TX, SEL, RST, SW and the control signal lines tx, sel, rst and output signal line vout. In the drawing, the position of a contact hole CH at each point of coupling is indicated. The position of a contact hole (indicated by reference mark VDD) coupled with a power supply wiring is also indicated.

In FIG. 7, further, the areas where a pixel unit PU is provided are defined by broken line. As already described, each pixel unit PU includes four photodiodes PD successively arranged in the column direction. In FIG. 7, the positions of three pixel units PU2a, PU2b, PU2c are indicated.

The pixel units PU are discriminated from one another by suffixing a character representing a column and a numeral representing their order in the respective columns to their reference numerals. (The characters a, b, c, . . . respectively correspond to first column, second column, third column, . . . ) For example, the pixel units PU in the first column are discriminated from one another by sequentially adding reference marks from the lower side (-Y direction side) of the drawing, like PU1a, PU2a, PU3a, . . . .

Hereafter, description will be sequentially given to the arrangement of each component in FIG. 7. The photodiodes PD are arranged over a semiconductor substrate at equal intervals both in the column direction and in the row direction. This is intended to match the optical center of each pixel with the center of the corresponding photodiode PD.

The floating diffusions FD individually correspond to the photodiodes PD and are provided in a position adjacent to the corresponding photodiode PD in the +Y direction. The transfer transistors TX are provided between a photodiode PD and a floating diffusion FD corresponding to each other.

In each row of the photodiode array PDA, the following measure is taken: in every two photodiodes PD, the corresponding floating diffusions FD comprise a pair (reference mark FDP) (referred to as floating diffusion pair, floating diffusion portion pair, or FD pair). For example, the floating diffusions FD corresponding to the photodiodes PD4a, PD4b comprise an FD pair (FDP). In FIG. 7, similarly, the floating diffusions FD corresponding to each of sets of (PD5b, PD5c), (PD6a, PD6b), (PD7b, PD7c), (PD8a, PD8b), and (PD9b, PD9c) comprise an FD pair (FDP).

As illustrated in FIG. 7, the floating diffusions FD comprising an FD pair (FDP) are placed in proximity to each other. In other words, the interval between two floating diffusions FD respectively corresponding two photodiodes PD adjoining to each other in the row direction is shorter in cases where they comprise an FD pair (FDP) than in cases where they do not comprise an FD pair (FDP).

The interval between floating diffusions FD that do not comprise an FD pair (FDP) in the row direction can be lengthened by the above configuration. In the pixel array portion 10, the areas between floating diffusions FD that do not comprise an FD pair (FDP) are used as transistor areas TRA (TRA1, TRA2) for placing the transistors AMI, SEL, RST, SW. The width of each transistor area TRA in the row direction is equivalent to the interval between adjoining floating diffusions FD that do not comprise an FD pair (FDP). Its width in the column direction is equivalent to the interval between rows of the photodiode array PDA adjoining to each other.

An area for the photodiodes PD enough to take in a sufficient amount of light received can be ensured by increasing the empty areas to place the transistors AMI, SEL, RST as mentioned above. As a result, the light receiving efficiency of the image pickup apparatus can be enhanced.

Further, the pixel array portion 10 in FIG. 7 is characterized in that as viewed in the column direction, the transfer transistors TX in each column are arranged in a staggered pattern. In other words, the FD pairs (FDPs) are arranged in a staggered pattern. That is, in adjoining rows of the photodiode array PDA, corresponding floating diffusions FD comprise an FD pair (FDP) every two photodiodes PD shifted by one column. In case of the example in FIG. 7, specifically, the FD pairs are comprised as described below. In the fourth, sixth, and eighth rows (R4, R6, R8), an FD pair (FDP) is comprised of floating diffusions FD corresponding to photodiodes PD in the first and second columns (C1, C2). In the fifth, seventh, and ninth rows (R5, R7, R9), meanwhile, an FD pair (FDP) is comprised of floating diffusions FD corresponding to photodiodes PD in the second and third columns (C2, C3).

As a result, it is possible to enhance the symmetrical property of the shape of the active region of each pixel including a photodiode PD and a floating diffusion FD corresponding thereto. In case of the pixel array portion 10 in FIG. 7, that is, the following is understood: the active regions of pixels adjoining to each other in an oblique direction are in the relation of translational symmetry; and the active regions of pixels adjoining to each other in the row direction are in the relation of line symmetry.

As already described, the following measure is taken in the Bayer arrangement of color filters: the color filters in green color (G) are arranged in a checkered pattern and the color filters in red color (R) and in blue color (B) are arranged in a checkered pattern in the remaining areas. In case of the example in FIG. 7, the shape of the active regions of pixels in green color (G) obliquely adjoining to each other is in the relation of translational symmetry. Therefore, it is possible to minimize the signal output difference between photodiodes PD for green color obliquely adjoining to each other. As a result, it is possible to reduce variation in characteristics from pixel to pixel.

Concrete description will be given to the arrangement of transistors AMI, SEL, RST, XT in transistor areas TRA (TRA1, TRA2). In each transistor area TRA, transistors AMI, SEL, RST, XT are placed two by two. At this time, the amplification transistor AMI and select transistor SEL corresponding to an identical pixel unit PU are placed in an identical first transistor area TRA1. The amplification transistor AMI and the select transistor SEL are coupled in series with the respective gate length directions substantially matched with the row direction and provided in a first transistor area TRA1. The reset transistor RST in each pixel unit PU is combined with the coupling transistor SW provided between it and the adjacent pixel unit PU and placed in a second transistor area TRA2. (The transistor areas are classified into first and second transistor areas TRA1, TRA2 according to the type of a transistor placed there.)

Description will be given with, for example, the pixel unit PU2a taken as representative. The amplification transistor AMI and select transistor SEL corresponding to the pixel unit PU2a are provided in the transistor area TRA1 adjoining to the photodiode PD7a, which is one of the photodiodes PD comprising the pixel unit PU2a, in the +Y direction. The amplification transistor AMI is provided on the side closer to the floating diffusion FD corresponding to the photodiode PD7a and the select transistor SEL is provided on the side farther from the same. The source region of the amplification transistor AMI and the drain region of the select transistor SEL are integrated with each other. This makes it possible to reduce a space required for arranging the transistors.

In case of the pixel unit PU2a, the reset transistor RST is provided in the transistor area TRA2 adjoining to the photodiode PD9a in the +Y direction. When it is provided, the reset transistor RST is combined with the coupling transistor SW coupling together the metal wiring FDL2a and the adjacent metal wiring FDL3a. The reset transistor RST and the coupling transistor SW are also series coupled and placed with their gate length directions substantially matched with the row direction. The source region of the reset transistor RST and the drain region of the coupling transistor SW are integrated with each other. This makes it possible to reduce a space required for arranging the transistors. The shape of the active regions of the reset transistor RST and coupling transistor SW is substantially identical with the shape of the active regions of the amplification transistor AMI and select transistor SEL.

When the whole of FIG. 7 is viewed, the first transistor area TRA1 where the amplification transistor AMI and the select transistor SEL are provided is placed in the following position: a position adjoining to the photodiodes PD in the sixth row (R6) and in the seventh row (R7) in the +Y direction. Meanwhile, the second transistor area TRA2 where the reset transistor RST and the coupling transistor SW are provided is placed in the following position: a position adjoining to the photodiodes PD in the fourth row (R4), fifth row (R5), eighth row (R8), and ninth row (R9) in the +Y direction. That is, a row in which the first transistor area TRA1 is placed in a position adjoining in the +Y direction and a row in which the second transistor area TRA2 is placed alternately occur every two rows of the pixel array portion 10.

Wiring of the control signal lines sel, rst, sw is facilitated by placing the transistors AMI, SEL, RST, SW as mentioned above. More specific description will be given. With respect to the fourth row (R4), fifth row (R5), eighth row (R8), and ninth row (R9) in which the second transistor area TRA2 is placed adjacently in the +Y direction, the following measure is taken: the control signal lines sw, rst are so wired that they run in proximity to the second transistor area TRA2. With respect to the sixth row (R6) and the seventh row (R7) in which the first transistor area TRA1 is placed adjacently in the +Y direction, the following measure is taken: the control signal line sel is so wired that it runs in proximity to the first transistor area TRA1.

The control signal lines tx (tx4 to tx9) are wired along in the row direction so that they run in proximity to the gate electrodes of the transfer transistors TX corresponding to photodiodes PD in each row. Each control signal line sel is coupled with the gate electrode of a select transistor SEL through a contact hole CH.

The output signal lines vout (vout1 to vout3), except the endmost output signal line vout, are provided in intercolumn areas. The intercolumn areas are areas where a photodiode is not provided between a column and a column adjoining to each other in the photodiode array PDA. Each output signal line vout is coupled with the source region of the select transistor SEL comprising each pixel unit PU provided in a corresponding column.

Each pixel unit PU is further provided with a metal wiring FDL for coupling floating diffusions FD. In case of the pixel unit PU2a in FIG. 7, for example, the metal wiring FDL2a for coupling the floating diffusions FD respectively corresponding to the photodiodes PD5a, PD6a, PD7a, PD8a is provided. The metal wiring FDL2a is also coupled with the source region of the corresponding reset transistor RST and the gate electrode layer of the amplification transistor AMI through a contact hole CH. (The above source region also functions as the drain region of a coupling transistor SW coupling adjoining pixel units PU together.)

Similarly, the pixel unit PU1a in the first column is provided with the metal wiring FDL1a and the pixel unit PU3a is provided with the metal wiring FDL3a. The pixel units PU1b, PU2b, ... in the second column are respectively provided with the metal wirings FDL1b, FDL2b, ... and the pixel units PU1c, PU2c, ... in the third column are respectively provided with the metal wirings FDL1c, FDL2c, ....

According to the image pickup apparatus 1 in the first embodiment, as described up to this point, the following can be implemented by adding a twist to the transistor arrangement in the pixel array portion 10: it is possible to place coupling transistors SW coupling together the charge storage portions FDU of pixel units PU adjoining to each other in the column direction with substantially no area penalty. Use of this coupling transistor SW makes it possible to obtain images with high picture quality over a wide ISO sensitivity range. More specific description will be given. In a low ISO sensitivity range within which light exposure is high, the saturation of signal level can be prevented by lower sensitivity readout in which a coupling transistor SW provided between adjacent pixel units PU is turned on. In a high ISO sensitivity range within which light exposure is low, an S/N ratio can be enhanced by two-pixel mixture readout. Further, when a moving image is recorded, the readout speed can be enhanced by three or more-pixel mixture readout.

(Second Embodiment)

Figure 8:
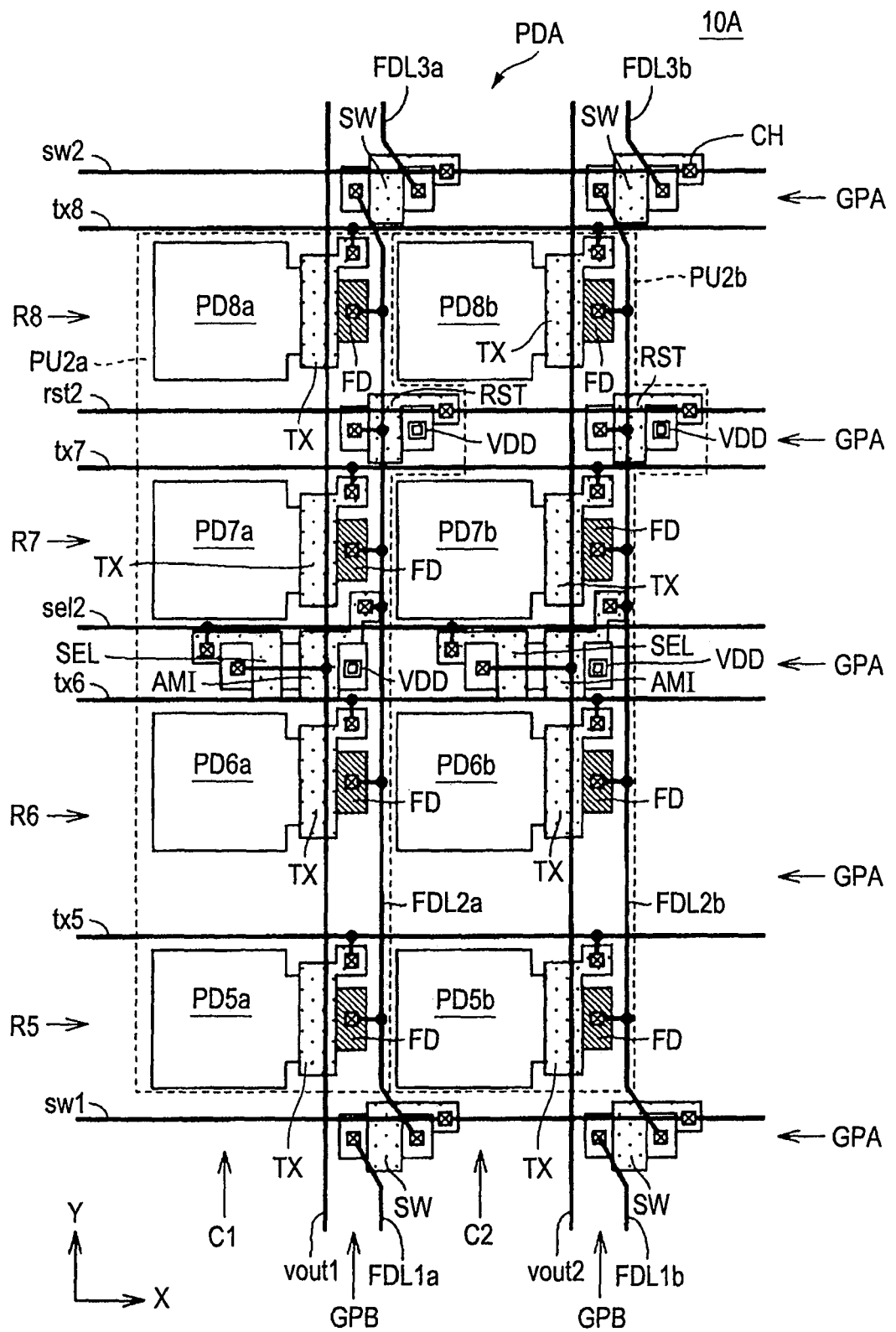
FIG. 8 is a plan view schematically illustrating the layout of a pixel array portion 10A.

FIG. 8 is a plan view schematically illustrating the layout of a pixel array portion 10A. The layout of the pixel array portion 10A in FIG. 8 is a modification to the layout of the pixel array portion 10 in the first embodiment illustrated in FIG. 7. FIG. 8 depicts photodiodes PD in the first and second columns (C1, C2) and in the fifth row to the eighth row (R5 to R8) of the photodiode array PDA. The photodiodes PD are arranged over a semiconductor substrate at equal intervals both in the column direction and in the row direction. In the following description, the same or equivalent parts as in FIG. 7 will be marked with the same reference marks and the description thereof may not be repeated.

In the pixel array portion 10A, four photodiodes PD in each column of the photodiode array PDA comprise a group and each group corresponds to a pixel unit PU. In case of the example in FIG. 8, specifically, the pixel unit PU2a includes the photodiodes PD5a, PD6a, PD7a, PD8a and the pixel unit PU2b includes the photodiodes PD5b, PD6b, PD7b, PD8b.

The floating diffusions FD individually correspond to the photodiodes PD and each floating diffusion FD is provided in a position adjacent to the corresponding photodiode PD in the +X direction. Each transfer transistor TX is provided between a photodiode PD and a floating diffusion FD corresponding to each other.

The transistors AMI, SEL, RST, SW are provided in an interrow area GPA that is an area where a photodiode PD is not provided between a row and a row of the photodiode array PDA adjoining to each other. At this time, the amplification transistor AMI and the select transistor SEL included in an identical pixel unit PU are arranged in an identical interrow area GPA so that they share an impurity region between them. It is more desirable that the directions of the respective gate lengths of the amplification transistor AMI and select transistor SEL should be substantially matched with the row direction.

The coupling transistors SW are provided in interrow areas GPA where neither the amplification transistor AMI nor the select transistor SEL is provided at intervals of four rows. The reset transistors RST are provided in interrow areas GPA where the amplification transistor AMI, select transistor SEL, or coupling transistor SW is not provided.

The control signal lines rst, sel, sw extended in the row direction are wired in an interrow area GPA so that they run substantially over the respective corresponding transistors RST, SEL, SW. The control signal lines tx are provided in correspondence with the individual rows of the photodiode array PDA and one control signal line tx is provided for one interrow area GPA.

The output signal lines vout extended in the column direction, except the endmost output signal line vout, are provided one by one in proximity to intercolumn areas GPB. The intercolumn areas GPB are areas where a photodiode PD is not provided between a column and a column of the photodiode array PDA adjoining to each other.

Each pixel unit PU is further provided with a metal wiring FDL for coupling floating diffusions FD. Each metal wiring FDL is coupled with the source region of the corresponding reset transistor RST and the gate electrode layer of the amplification transistor AMI through a contact hole CH.

In case of the pixel array portion 10 in the first embodiment, there is the following difference between the pixel units PU provided in the odd-numbered columns of the photodiode array PDA and the pixel units PU provided in the even-numbered columns: they are different in the control signal lines to which the respective transistors SEL, RST, SW are coupled. In case of the pixel array portion 10A in the second embodiment, meanwhile, the following measure is taken with respect to the pixel units PU arranged in the row direction: only one control signal line is coupled to each of the transistors SEL, RST, SW. Therefore, the number of the control signal lines rst, sel, sw can be reduced as compared with the first embodiment.

(Example of Application of Image Pickup Apparatus in First or Second Embodiment to Camera)

Figure 9:
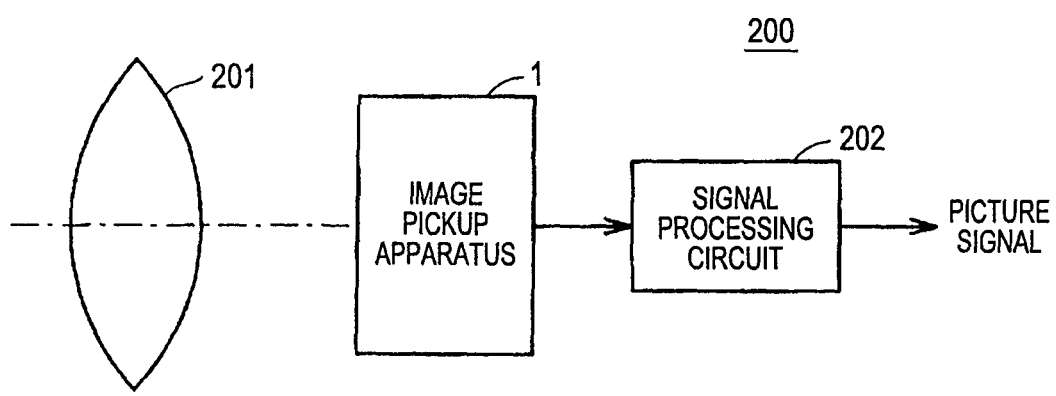
FIG. 9 is a block diagram schematically illustrating the configuration of a digital still camera 200 using the image pickup apparatus 1 in the first and second embodiments of the invention.

FIG. 9 is a block diagram schematically illustrating the configuration of a digital still camera 200 using an image pickup apparatus 1 in the first or second embodiment of the invention.

As illustrated in FIG. 9, the digital still camera 200 includes: the above image pickup apparatus 1; an image pickup lens 201 as an imaging optical system for providing an image of a subject on the pixel array portion 10, 10A of this image pickup apparatus 1; and a signal processing circuit 202 that processes the output signals of the image pickup apparatus 1. The digital still camera 200 can obtain picture signals with high picture quality over a wide dynamic range by using the above image pickup apparatus 1. The above application is not limited to the digital still camera 200 and the same effect can be obtained by using the above image pickup apparatus 1 for any other image pickup system such as a digital video camera.

It should be understood that the embodiments disclosed in this application are just examples in every respect and are not limitative. The scope of this invention is indicated not by the above description but by claims. It is intended to include all the modifications within the meaning and scope equivalent to claims.

What is claimed is:

1. An image pickup apparatus comprising:
   a plurality of pixel units,
   wherein each of the pixel units includes:
   a plurality of photoelectric conversion elements each producing electric charges corresponding to incident light;
   a plurality of transfer transistors respectively corresponding to the photoelectric conversion elements and each transferring electric charges generated at the corresponding photoelectric conversion element; and
   a charge storage portion coupled with the photoelectric conversion elements through the transfer transistors and storing electric charges generated at each of the photoelectric conversion elements,
   wherein each of the pixel units further includes a plurality of coupling transistors coupling together the charge storage portions of two pixel units of the pixel units, wherein each of the pixel units is coupled with at least one of the coupling transistors, wherein the image pickup apparatus further comprises a scanning circuit switching on or off the transfer transistors and the coupling transistors included in each of the pixel units, wherein the image pickup apparatus has normal read mode and lower sensitivity read mode as read modes for individually reading electric charges generated at each photoelectric conversion element of the pixel units on a photoelectric conversion element-by-photoelectric conversion element basis, wherein when reading electric charges of a first photoelectric conversion element included in a first pixel unit to be read in the normal read mode, the scanning circuit turns on a transfer transistor corresponding to the first photoelectric conversion element and turns off every coupling transistor coupled with the charge storage portion of the first pixel unit, and wherein when reading electric charges of the first photoelectric conversion element in the lower sensitivity read mode, the scanning circuit turns on a transfer transistor corresponding to the first photoelectric conversion element and turns on at least one coupling transistor coupled with the charge storage portion of the first pixel unit.

2. The image pickup apparatus according to claim 1, having first mixture read mode for mixing and reading electric charges generated at each photoelectric conversion element of the pixel units by at least two photoelectric conversion elements included in an identical pixel unit, and wherein when mixing and reading electric charges of at least two photoelectric conversion elements included in a first pixel unit to be read in the first mixture read mode, the scanning circuit turns on a plurality of transfer transistors respectively corresponding to at least two photoelectric conversion elements to be read and turns off every coupling transistor coupled with the charge storage portion of the first pixel unit.

3. The image pickup apparatus according to claim 1, having second mixture read mode for mixing and reading electric charges generated at each photoelectric conversion element of the pixel units by at least two photoelectric conversion elements included across a plurality of pixel units, and wherein when mixing and reading electric charges of at least one photoelectric conversion element included in a first pixel unit to be read and at least one photoelectric conversion element included in a second pixel unit the charge storage portion of which is coupled with the charge storage portion of the first pixel unit through a coupling transistor in the second mixture read mode, the scanning circuit turns on a transfer transistor corresponding to at least one photoelectric conversion element to be read included in the first pixel unit, turns on a transfer transistor corresponding to at least one photoelectric conversion element to be read included in the second pixel unit, and turns on a coupling transistor coupling together the charge storage portion of the first pixel unit and the charge storage portion of the second pixel unit.

4. An image pickup apparatus comprising:
a plurality of pixel units,
wherein each of the pixel units includes:
a plurality of photoelectric conversion elements each producing electric charges corresponding to incident light;
a plurality of transfer transistors respectively corresponding to the photoelectric conversion elements and each transferring electric charges generated at the corresponding photoelectric conversion element; and
a charge storage portion coupled with the photoelectric conversion elements through the transfer transistors and storing electric charges generated at each of the photoelectric conversion elements, wherein each of the pixel units further includes a plurality of coupling transistors coupling together the charge storage portions of two pixel units of the pixel units, wherein each of the pixel units is coupled with at least one of the coupling transistors, wherein the image pickup apparatus further comprises a scanning circuit switching on or off the transfer transistors and the coupling transistors included in each of the pixel units, wherein each of the pixel units further includes:
an amplification transistor outputting a signal corresponding to electric charges stored in the charge storage portion;
a reset transistor discharging electric charges stored in the charge storage portion; and
a select transistor coupled with the amplification transistor and used to bring each pixel unit into a selected state, wherein in each of the pixel units, the amplification transistor and the select transistor have an impurity region common thereto, wherein the reset transistor of either pixel unit of two pixel units coupled with each other and a coupling transistor coupling these pixel units together have an impurity region common thereto, wherein the photoelectric conversion elements included in the pixel units are arranged in a matrix pattern and comprise a photoelectric conversion element array, wherein in each of the pixel units, the charge storage portion includes a plurality of floating diffusion portions respectively corresponding to the photoelectric conversion elements and electrically coupled with one another, wherein each of the floating diffusion portions is provided on a first side of a corresponding photoelectric conversion element in the column direction with a corresponding transfer transistor in-between, wherein for every two photoelectric conversion elements in each row of the photoelectric conversion element array, corresponding floating diffusion portions comprise a floating diffusion portion pair, and wherein the interval between two floating diffusion portions comprising each floating diffusion portion corresponds to photoelectric conversion elements adjoining to each other in the row direction and is narrower than the interval between two floating diffusion portions that do not comprise a floating diffusion portion pair.

5. The image pickup apparatus according to claim 4,
wherein in rows of the photoelectric conversion element array adjoining to each other, corresponding floating diffusion portions comprise the floating diffusion portion pair for every two photoelectric conversion elements shifted from each other by one column.

6. The image pickup apparatus according to claim 4,
wherein the number of the photoelectric conversion elements included in each of the pixel units is four,
wherein the photoelectric conversion elements in each column of the photoelectric conversion element array are included in any one of the pixel units by four successively arranged photoelectric conversion elements, and wherein each of the coupling transistors couples together the charge storage portions of pixel units of the photoelectric conversion element array adjoining to each other in the column direction.

7. The image pickup apparatus according to claim 6,
wherein the amplification transistor and select transistor in each of the pixel units are provided in a first transistor area individually corresponding to each of the pixel units,
wherein the reset transistor in each of the pixel units is provided, together with a coupling transistor having an impurity region common thereto, in a second transistor area individually corresponding to each of the pixel units, and
wherein each of the first and second transistor areas is an area corresponding to photoelectric conversion elements adjoining to each other in the row direction and positioned between two floating diffusion portions that do not comprise the floating diffusion portion pair.

8. The image pickup apparatus according to claim 7,
wherein the rows of the photoelectric conversion element array include:
a first row in which only the first transistor area is adjacently arranged on the first side in the column direction; and
a second row in which only the second transistor area is adjacently arranged on the first side in the column direction, and
wherein the first row and the second row are alternately and repeatedly arranged every two rows.

9. The image pickup apparatus according to Claim 4,
wherein the photoelectric conversion elements included in the pixel units are arranged in a matrix pattern and comprise a photoelectric conversion element array,
wherein the number of the photoelectric conversion elements included in each of the pixel units is four,
wherein the photoelectric conversion elements in each column of the photoelectric conversion element array are included in any one of the pixel units by four successively arranged photoelectric conversion elements,
wherein each of the coupling transistors couples together the charge storage portions of pixel units of the photoelectric conversion element array adjoining to each other in the column direction,
wherein in each of the pixel units, the charge storage portion includes a plurality of floating diffusion portions respectively corresponding to the photoelectric conversion elements and electrically coupled with one another,
wherein each of the floating diffusion portions is provided on a first side of a corresponding photoelectric conversion element in the row direction of the photoelectric conversion element array with a corresponding transfer transistor in-between, and
wherein the amplification transistor, reset transistor, and select transistor in each of the pixel units and the coupling transistors are provided in an interrow area, which is an area where a photoelectric conversion element is not provided between a row and a row of the photoelectric conversion element array adjoining to each other.

\* \* \* \* \*